United States Patent
Ding et al.

(10) Patent No.: US 9,787,056 B2
(45) Date of Patent: Oct. 10, 2017

(54) METHOD, APPARATUS, OPTICAL COMPONENT AND OPTICAL NETWORK SYSTEM FOR CONTROLLING OPERATING TEMPERATURE OF OPTICAL COMPONENT

(71) Applicant: Huawei Technologies Co., Ltd., Shenzhen, Guangdong (CN)

(72) Inventors: Ping Ding, Shenzhen (CN); Wei Ling, Shenzhen (CN); Sanzhong Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/159,481

(22) Filed: May 19, 2016

(65) Prior Publication Data
US 2016/0268771 A1 Sep. 15, 2016

Related U.S. Application Data

(63) Continuation of application No. PCT/CN2014/072971, filed on Mar. 6, 2014.

(51) Int. Cl.
*H01S 5/06* (2006.01)
*H01S 5/024* (2006.01)
(Continued)

(52) U.S. Cl.
CPC ......... *H01S 5/0612* (2013.01); *H04B 10/572* (2013.01); *H04J 14/0221* (2013.01);
(Continued)

(58) Field of Classification Search
CPC ............... H01S 5/0612; H01S 5/02415; H01S 5/06804; H04B 10/572; H04Q 11/0067; H04Q 2011/0039; H04J 14/0221
(Continued)

(56) References Cited

U.S. PATENT DOCUMENTS

2003/0152390 A1* 8/2003 Stewart ................. H04B 10/40
398/135
2004/0202421 A1 10/2004 Kazuo et al.
(Continued)

FOREIGN PATENT DOCUMENTS

CN 102916336 A 2/2013
CN 102970080 A 3/2013
(Continued)

*Primary Examiner* — Dalzid Singh (57) ABSTRACT

The present invention discloses a method, an apparatus, an optical component and an optical network system for controlling an operating temperature of an optical component. The method includes: acquiring an external ambient temperature of the optical component; setting a target control temperature of a temperature controller according to the external ambient temperature, where the target control temperature is a function value of the external ambient temperature, and the target control temperature is within a range from an operating temperature lower limit of a laser to an operating temperature upper limit of the laser; and controlling, according to the target control temperature, an operating temperature of the optical component by means of heating or cooling by using the temperature controller.

19 Claims, 5 Drawing Sheets (51) Int. Cl.
    *H01S 5/068*        (2006.01)
    *H04B 10/572*      (2013.01)
    *H04J 14/02*        (2006.01)
    *H04Q 11/00*       (2006.01)

(52) U.S. Cl.
    CPC ...... *H04Q 11/0067* (2013.01); *H01S 5/02415* (2013.01); *H01S 5/06804* (2013.01); *H04Q 2011/0039* (2013.01)

(58) Field of Classification Search
    USPC .......................................................... 398/68
    See application file for complete search history.

(56) References Cited

U.S. PATENT DOCUMENTS

| | | | | |
|---|---|---|---|---|
| 2009/0257468 | A1* | 10/2009 | McMahan | H04M 1/22 372/107 |
| 2013/0279115 | A1* | 10/2013 | Blumenthal | H05K 7/20336 361/700 |
| 2014/0233944 | A1* | 8/2014 | Vetter | H04J 14/0282 398/34 |
| 2015/0055960 | A1* | 2/2015 | Zheng | H04B 10/503 398/135 |
| 2015/0245114 | A1* | 8/2015 | Ho | H04B 10/079 398/34 |

FOREIGN PATENT DOCUMENTS

| | | |
|---|---|---|
| CN | 103281132 A | 9/2013 |
| CN | 103368060 A | 10/2013 |
| WO | 03083537 A1 | 10/2003 |

\* cited by examiner

When the external ambient temperature is lower than or equal to the operating temperature lower limit of the laser, determine that the operating temperature lower limit of the laser is the target control temperature of the temperature controller ~ S121

When the external ambient temperature is higher than or equal to the operating temperature upper limit of the laser, determine that the operating temperature upper limit of the laser is the target control temperature of the temperature controller ~ S122

When the external ambient temperature is lower than or equal to the operating temperature upper limit of the laser and the external ambient temperature is higher or equal to the operating temperature lower limit of the laser, determine that the external ambient temperature of the optical component is the target control temperature of the temperature controller ~ S123

When the external ambient temperature is higher than or equal to the operating temperature lower limit of the laser, set the target control temperature to being in a linear relationship or curve linear relationship with the external ambient temperature ~ S124

METHOD, APPARATUS, OPTICAL COMPONENT AND OPTICAL NETWORK SYSTEM FOR CONTROLLING OPERATING TEMPERATURE OF OPTICAL COMPONENT

CROSS-REFERENCE TO RELATED APPLICATIONS

This application is a continuation of International Application No. PCT/CN2014/072971, filed on Mar. 6, 2014, which is hereby incorporated by reference in its entirety.

TECHNICAL FIELD

The present invention relates to the field of optical networks, and in particular, to a method, an apparatus, an optical component and an optical network system for controlling an operating temperature of an optical component.

BACKGROUND

10 G passive optical networks (PON for short) include a 10 G bit/S Ethernet passive optical network (10 G EPON for short) and a 10 G bit passive optical network (XG PON for short). A standard organization defines that an optical line terminal (OLT for short) of a 10 G passive optical network uses an optical signal with wavelength of 1577 nm and a wavelength range from 1575 nm to 1580 nm. To satisfy the foregoing requirement, a laser of the 10 G passive optical network needs to use an electricity absorb modulate laser (EML for short).

An EML laser is usually required to work within a certain temperature range. Therefore, a thermal electric cooler (TEC for short) may generally be used to perform heating or cooling, so as to control an operating temperature of the EML laser.

An optical sub-assembly (OSA for short) or a transmitter optical sub-assembly (TOSA for short) that includes an EML laser may include a thermistor, a laser diode (LD for short), an electricity absorption (, EA for short) modulator, and a TEC, where the thermistor is configured to monitor an operating temperature inside the TEC, the LD is configured to send a single-longitudinal-mode laser with wavelength of 1577 nm, the EA modulator is configured to perform modulating and coding on an optical signal, and the TEC is configured to control operating temperatures of the LD and EA modulator, so as to control an operating temperature of the OSA.

Within a whole operating temperature range of the OSA or TOSA that includes the EML laser, a target control temperature of the thermal electric cooler TEC is a constant temperature. Specifically, when the OSA or TOSA works at a high temperature, the TEC needs to be cooled to the constant temperature; and when the OSA or TOSA works at a low temperature, the TEC needs to be heated to the constant temperature. Therefore, to ensure that the EML laser works at a constant temperature, the power consumption of the TEC is quite large.

SUMMARY

Embodiments of the present invention provide a method, an apparatus, an optical component, and an optical network system for controlling an operating temperature of an optical component, which can reduce power consumption of a temperature controller by means of improving a temperature control manner of the temperature controller.

According to a first aspect, a method for controlling an operating temperature of an optical component is provided, and the optical component includes a laser and a temperature controller that is used for heating or cooling inside the optical component, where the method includes: acquiring an external ambient temperature of the optical component; setting a target control temperature of the temperature controller according to the external ambient temperature, where the target control temperature is a function value of the external ambient temperature, and the target control temperature is within a range from an operating temperature lower limit of the laser to an operating temperature upper limit of the laser; and controlling, according to the target control temperature, an operating temperature of the optical component by means of heating or cooling by using the temperature controller.

With reference to the first aspect, in a first possible implementation manner of the first aspect, the setting a target control temperature of the temperature controller includes: when the external ambient temperature is lower than or equal to the operating temperature lower limit of the laser, determining that the operating temperature lower limit of the laser is the target control temperature of the temperature controller.

With reference to the first aspect or the first possible implementation manner of the first aspect, in a second possible implementation manner of the first aspect, the setting a target control temperature of the temperature controller includes: when the external ambient temperature is higher than or equal to the operating temperature upper limit of the laser, determining that the operating temperature upper limit of the laser is the target control temperature of the temperature controller.

With reference to the first aspect or the first or second possible implementation manner of the first aspect, in a third possible implementation manner of the first aspect, the setting a target control temperature of the temperature controller includes: when the external ambient temperature is lower than or equal to the operating temperature upper limit of the laser and the external ambient temperature is higher than or equal to the operating temperature lower limit of the laser, determining that the external ambient temperature of the optical component is the target control temperature of the temperature controller.

With reference to the first aspect or the first possible implementation manner of the first aspect, in a fourth possible implementation manner of the first aspect, the setting a target control temperature of the temperature controller includes: when the external ambient temperature is higher than or equal to the operating temperature lower limit of the laser, setting the target control temperature to being in a linear relationship or curve linear relationship with the external ambient temperature.

With reference to the first aspect or any one possible implementation manner of the first to fourth possible implementation manners of the first aspect, in a fifth possible implementation manner of the first aspect, the operating temperature lower limit of the laser is within a range from 45° C. to 54° C.; and/or the operating temperature upper limit of the laser is within a range from 56° C. to 65° C.

According to a second aspect, an optical component is provided and the optical component includes an optical sub-assembly OSA, where a laser, a temperature controller, and an internal temperature sensor are disposed in the OSA, and the internal temperature sensor is configured to detect an OSA temperature inside the OSA; a micro control unit MCU, where the MCU is configured to set a target control temperature of the temperature controller; a proportional-integral-derivative PID circuit, where the PID circuit is configured to acquire the OSA temperature detected by the internal temperature sensor and the target control temperature set by the MCU, and output a control value according to the target control temperature and the OSA temperature; and a temperature controller drive circuit, where the temperature controller drive circuit is configured to provide, according to the control value output by the PID circuit, a current that is used for heating or cooling for the temperature controller, so as to control the OSA temperature inside the OSA; and the optical component further includes an ambient temperature sensor configured to detect an external ambient temperature of the OSA, the MCU is specifically configured to acquire the external ambient temperature that is of the OSA and is detected by the ambient temperature sensor, and set the target control temperature of the temperature controller according to the external ambient temperature, where the target control temperature is a function value of the external ambient temperature and the target control temperature is within a range from an operating temperature lower limit of the laser to an operating temperature upper limit of the laser.

With reference to the second aspect, in a first possible implementation manner of the second aspect, the MCU is specifically configured to: when the external ambient temperature is lower than or equal to the operating temperature lower limit of the laser, determine that the operating temperature lower limit of the laser is the target control temperature of the temperature controller.

With reference to the second aspect or the first possible implementation manner of the second aspect, in a second possible implementation manner of the second aspect, the MCU is specifically configured to: when the external ambient temperature is higher than or equal to the operating temperature upper limit of the laser, determine that the operating temperature upper limit of the laser is the target control temperature of the temperature controller.

With reference to the second aspect or the first or second possible implementation manner of the second aspect, in a third possible implementation manner of the second aspect, the MCU is specifically configured to: when the external ambient temperature is lower than or equal to the operating temperature upper limit of the laser and the external ambient temperature is higher than or equal to the operating temperature lower limit of the laser, determine that the external ambient temperature of the optical component is the target control temperature of the temperature controller.

With reference to the second aspect or the first possible implementation manner of the first aspect, in a fourth possible implementation manner of the second aspect, the MCU is specifically configured to: when the external ambient temperature is higher than or equal to the operating temperature lower limit of the laser, set the target control temperature to being in a linear relationship or curve linear relationship with the external ambient temperature.

With reference to the second aspect or any one possible implementation manner of the first to fourth possible implementation manners of the second aspect, in a fifth possible implementation manner of the second aspect, the operating temperature lower limit of the laser is within a range from 45° C. to 54° C.; and/or the operating temperature upper limit of the laser is within a range from 56° C. to 65° C.

According to a third aspect, an apparatus for controlling an operating temperature of an optical component is provided and the optical component includes a laser and a temperature controller that is used for heating or cooling inside the optical component, where the apparatus includes: a processor, a memory, and a bus system, where the processor and the memory are connected by using the bus system, the memory is configured to store an instruction, the processor is configured to execute the instruction stored in the memory, and the processor is configured to: acquire an external ambient temperature of the optical component; set a target control temperature of the temperature controller according to the external ambient temperature, where the target control temperature is a function value of the external ambient temperature, and the target control temperature is within a range from an operating temperature lower limit of the laser to an operating temperature upper limit of the laser; and controlling, according to the target control temperature, an operating temperature of the optical component by means of heating or cooling by using the temperature controller.

With reference to the third aspect, in a first possible implementation manner of the third aspect, that the processor sets a target control temperature of the temperature controller includes: when the external ambient temperature is lower than or equal to the operating temperature lower limit of the laser, determining that the operating temperature lower limit of the laser is the target control temperature of the temperature controller.

With reference to the third aspect or the first possible implementation manner of the third aspect, in a second possible implementation manner of the third aspect, that the processor sets a target control temperature of the temperature controller includes: when the external ambient temperature is higher than or equal to the operating temperature upper limit of the laser, determining that the operating temperature upper limit of the laser is the target control temperature of the temperature controller.

With reference to the third aspect or the first or second possible implementation manner of the third aspect, in a third possible implementation manner of the third aspect, that the processor sets a target control temperature of the temperature controller includes: when the external ambient temperature is lower than or equal to the operating temperature upper limit of the laser and the external ambient temperature is higher than or equal to the operating temperature lower limit of the laser, determining that the external ambient temperature of the optical component is the target control temperature of the temperature controller.

With reference to the third aspect or the first possible implementation manner of the third aspect, in a fourth possible implementation manner of the third aspect, that the processor sets a target control temperature of the temperature controller includes: when the external ambient temperature is higher than or equal to the operating temperature lower limit of the laser, setting the target control temperature to being in a linear relationship or curve linear relationship with the external ambient temperature.

With reference to the third aspect or any one possible implementation manner of the first to fourth possible implementation manners of the third aspect, in a fifth possible implementation manner of the third aspect, the operating temperature lower limit of the laser is within a range from 45° C. to 54° C.; and/or the operating temperature upper limit of the laser is within a range from 56° C. to 65° C.

According to a fourth aspect, an optical network system is provided and the optical network system includes: an optical line terminal OLT, where the OLT includes an optical component according to an embodiment of the present invention, or an apparatus according to an embodiment of the present invention; at least one optical network terminal ONT; and an optical splitter, where the at least one ONT is connected to the OLT by using the optical splitter;

the optical component includes: an optical sub-assembly OSA, where a laser, a temperature controller, and an internal temperature sensor are disposed in the OSA, and the internal temperature sensor is configured to detect an OSA temperature inside the OSA; a micro control unit MCU, where the MCU is configured to set a target control temperature of the temperature controller; a proportional-integral-derivative PID circuit, where the PID circuit is configured to acquire the OSA temperature detected by the internal temperature sensor and the target control temperature set by the MCU, and output a control value according to the target control temperature and the OSA temperature; and a temperature controller drive circuit, where the temperature controller drive circuit is configured to provide, according to the control value output by the PID circuit, a current that is used for heating or cooling for the temperature controller, so as to control the temperature inside the OSA; and the optical component further includes an ambient temperature sensor configured to detect an external ambient temperature of the OSA, the MCU is specifically configured to acquire the external ambient temperature that is of the OSA and is detected by the ambient temperature sensor, and set the target control temperature of the temperature controller according to the external ambient temperature, where the target control temperature is a function value of the external ambient temperature and the target control temperature is within a range from an operating temperature lower limit of the laser to an operating temperature upper limit of the laser;

the apparatus includes a processor, a memory, and a bus system, where the processor and the memory are connected by using the bus system, the memory is configured to store an instruction, the processor is configured to execute the instruction stored in the memory, and the processor is configured to: acquire an external ambient temperature of the optical component; set, according to the external ambient temperature, a target control temperature of the temperature controller that is used for heating or cooling inside the optical component, where the target control temperature is a function value of the external ambient temperature, and the target control temperature is within the range from the operating temperature lower limit of the laser to the operating temperature upper limit of the laser; and control, according to the target control temperature, an operating temperature of the optical component by means of heating or cooling by using the temperature controller.

Based on the foregoing technical solutions, the method, apparatus, optical component, and optical network system for controlling an operating temperature of an optical component in the embodiments of the present invention can, by means of acquiring an external ambient temperature of the optical component and setting a target control temperature of a temperature controller according to the external ambient temperature, dynamically adjust the target control temperature of the temperature controller and improve a temperature control manner of the temperature controller, therefore can avoid a problem of relatively large power consumption caused by controlling, by the temperature controller, a temperature of the optical component to a constant temperature, which can reduce a control current of the temperature controller, and can obviously reduce the power consumption of the temperature controller.

BRIEF DESCRIPTION OF THE DRAWINGS

To describe the technical solutions in the embodiments of the present invention more clearly, the following briefly introduces the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

It should be understood that, the technical solutions of the embodiments of the present invention may be applied to various optical networks, especially a passive optical network, for example: a gigabit-capable passive optical network (GPON for short) system, an EPON system, and an XG PON system. Furthermore, for ease of description, a 10 G PON system is used as an example for description in the following, but the present invention is not limited to this.

It should be further understood that, the technical solutions of the embodiments of the present invention may be applied to an EML laser, may also be applied to a distributed feedback laser (DFB for short), and may also be applied to other lasers. In the embodiments of the present invention, only the EML laser is used as an example for description, but the present invention is not limited thereto.

Figure 1:
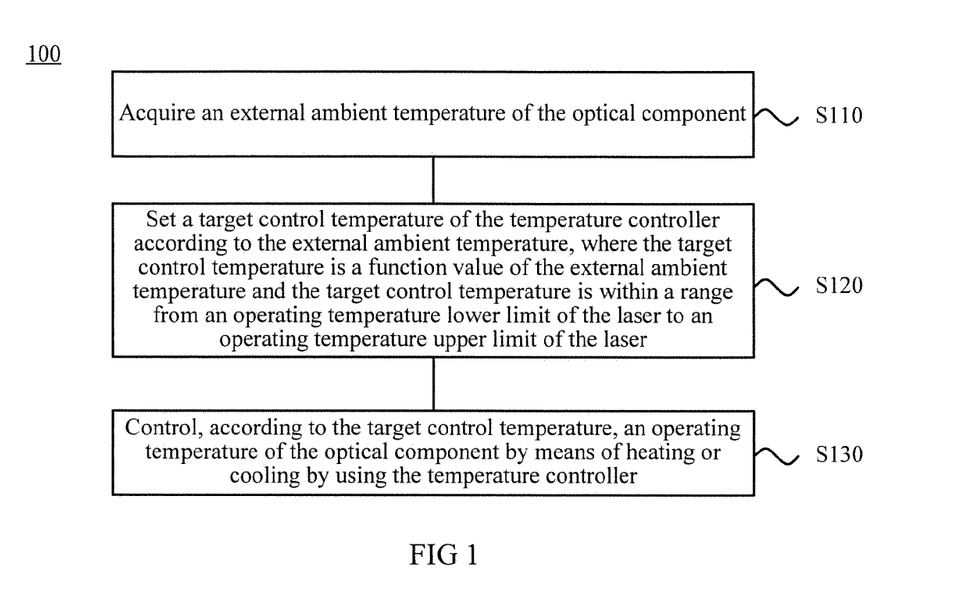
FIG. 1 is a schematic flowchart of a method for controlling an operating temperature of an optical component according to an embodiment of the present invention.

FIG. 1 shows a schematic flowchart of a method 100 for controlling an operating temperature of an optical component according to an embodiment of the present invention, where the method 100 may be executed by an apparatus for controlling an operating temperature of an optical component, for example, the method 100 may be executed by an optical component or executed by a control unit in an optical component. The optical component may include a laser and a temperature controller that is used for heating or cooling inside the optical component. As shown in FIG. 1, the method 100 includes:

S110. Acquire an external ambient temperature of the optical component;

S120. Set a target control temperature of the temperature controller according to the external ambient temperature, where the target control temperature is a function value of the external ambient temperature and the target control temperature is within a range from an operating temperature lower limit of the laser to an operating temperature upper limit of the laser;

S130. Control, according to the target control temperature, an operating temperature of the optical component by means of heating or cooling by using the temperature controller.

Specifically, to reduce the power consumption of the temperature controller in the optical component, the apparatus for controlling an operating temperature of an optical component may acquire the external ambient temperature of the optical component, therefore can dynamically set the target control temperature of the temperature controller according to the external ambient temperature, where the target control temperature may be a function value of the external ambient temperature, and the target control temperature is within the range from the operating temperature lower limit of the laser to the operating temperature upper limit of the laser, so as to ensure that the laser can work normally, therefore, the apparatus for controlling an operating temperature of an optical component may control, according to the target control temperature, an operating temperature of the optical component by means of heating or cooling by using the temperature controller.

Therefore, compared with a solution of controlling a temperature to a constant temperature regardless of whether an external ambient temperature is high or low in the prior art, a method for controlling an operating temperature of an optical component according to the embodiment of the present invention can dynamically set the target control temperature of the temperature controller according to the external ambient temperature of the optical component, so as to reduce, under a situation in which the laser can work normally, a temperature difference between the target control temperature and the external ambient temperature of the optical component as much as possible, which can obviously reduce the power consumption of the temperature controller.

Therefore, the method for controlling an operating temperature of an optical component in the embodiment of the present invention can, by means of acquiring an external ambient temperature of the optical component and setting a target control temperature of a temperature controller according to the external ambient temperature, dynamically adjust the target control temperature of the temperature controller and improve a temperature control manner of the temperature controller, therefore can avoid a problem of relatively large power consumption caused by controlling, by the temperature controller, a temperature of the optical component to a constant temperature, which can reduce a control current of the temperature controller, and can obviously reduce the power consumption of the temperature controller.

Figure 2:
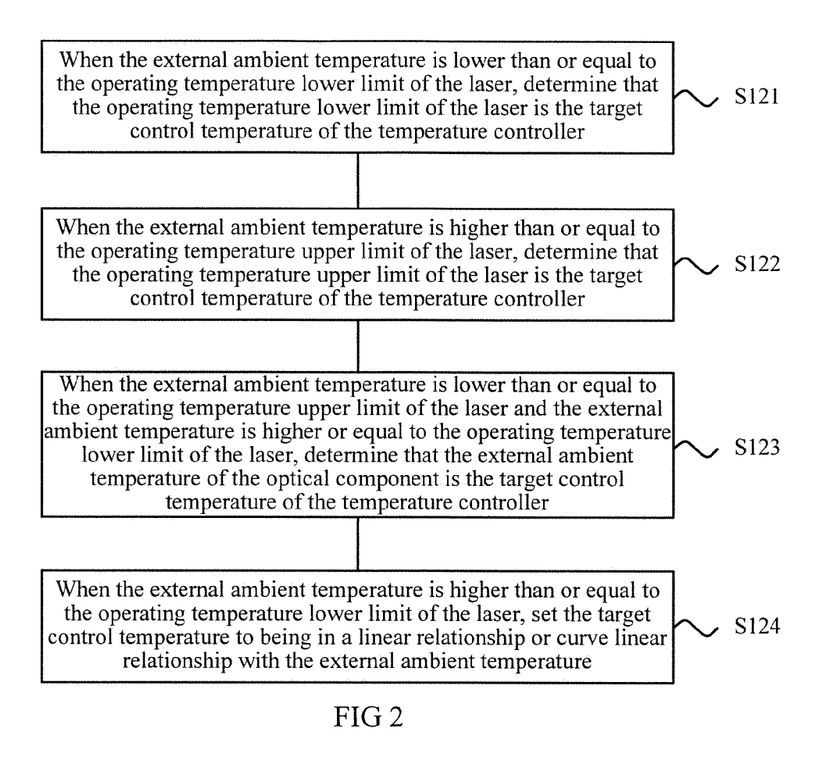
FIG. 2 is a schematic flowchart of a method for setting a target control temperature of a temperature controller according to an embodiment of the present invention.
Figure 3:
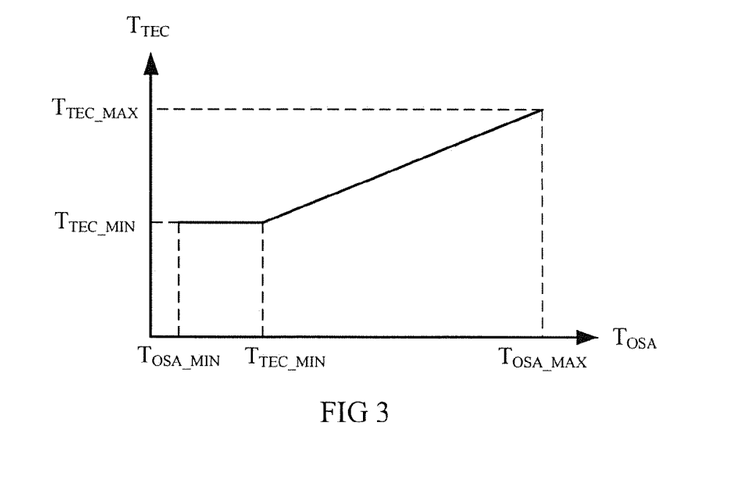
FIG. 3 is a schematic diagram of a relationship between a target control temperature of a temperature controller and an external ambient temperature according to an embodiment of the present invention.
Figure 4:
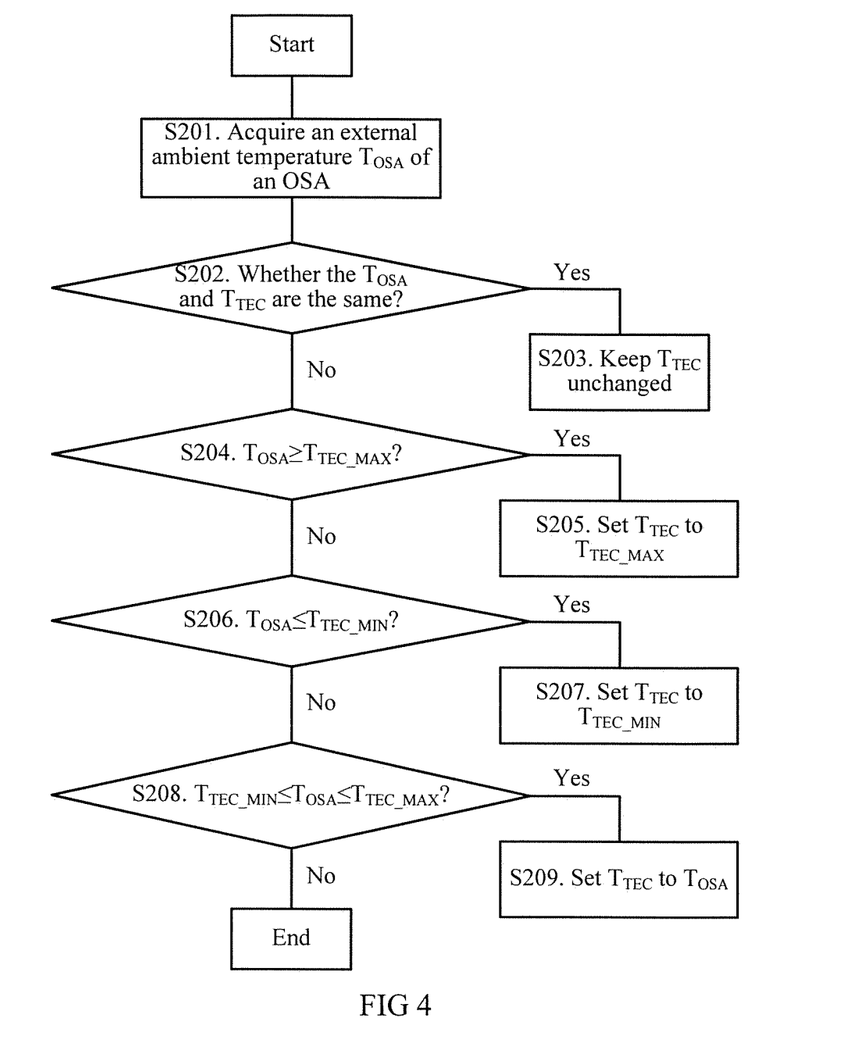
FIG. 4 is another schematic flowchart of a method for controlling an operating temperature of an optical component according to an embodiment of the present invention.

With reference to FIG. 2 to FIG. 4, the following further describes the method for controlling an operating temperature of an optical component according to the embodiment of the present invention in detail.

In the embodiment of the present invention, optionally, as shown in FIG. 2, the setting a target control temperature of the temperature controller includes:

S121. When the external ambient temperature is lower than or equal to the operating temperature lower limit of the laser, determine that the operating temperature lower limit of the laser is the target control temperature of the temperature controller.

Specifically, for example, it is assumed that the operating temperature lower limit of the laser is 50° C., when the external ambient temperature of the optical component is lower than or equal to the operating temperature lower limit of the laser, for example, the external ambient temperature of the optical component is 25° C., the target control temperature of the temperature controller may be set to 50° C. Therefore, compared with a solution of setting the target control temperature to a constant temperature, for example, the constant temperature is 55° C., the method according to the embodiment of the present invention only needs the temperature controller to increase an internal temperature of the optical component to 50° C., and therefore may enable the laser to work normally, but does not need the temperature controller to further increase the internal temperature of the optical component from 50° C. to 55° C., which can obviously reduce the power consumption of the temperature controller.

That is, in the embodiment of the present invention, when the external ambient temperature is lower than or equal to the operating temperature lower limit of the laser, only the operating temperature lower limit of the laser needs to be determined to be the target control temperature of the temperature controller, so that while the laser works normally, the power consumption of the temperature controller can be obviously reduced.

In the embodiment of the present invention, optionally, the operating temperature lower limit of the laser is within a range from 45° C. to 54° C.; and/or the operating temperature upper limit of the laser is within a range from 56° C. to 65° C.

Specifically, in the embodiment of the present invention, the laser is, for example, an EML laser, and the temperature controller is, for example, a TEC. The operating temperature lower limit of the laser may be such as 45° C., 48° C., 50° C., 52° C., or 54° C. It should be understood that, the operating temperature lower limit of the laser may also be another temperature value, for example, the operating temperature lower limit of the laser is within a range from 50° C. to 55° C.; for another example, the operating temperature lower limit of the laser is within a range from 40° C. to 50° C.; and for still another example, the operating temperature lower limit of the laser is within a range from 50° C. to 60° C. For example, the operating temperature lower limit of the laser may be 40° C., 45° C., 50° C., 55° C., 60° C., or the like.

According to another aspect, in the embodiment of the present invention, the operating temperature upper limit of the laser may be such as 56° C., 58° C., 60° C., 62° C., or 65° C. It should be understood that, the operating temperature upper limit of the laser may also be another temperature value, for example, the operating temperature upper limit of the laser is within a range from 55° C. to 60° C.; for another example, the operating temperature upper limit of the laser is within a range from 45° C. to 55° C.; and for still another example, the operating temperature upper limit of the laser is within a range from 55° C. to 65° C. For example, the operating temperature upper limit of the laser may be 45° C., 50° C., 55° C., 60° C., 65° C., or the like.

In the embodiment of the present invention, optionally, as shown in FIG. 2, the setting a target control temperature of the temperature controller includes:

S122. When the external ambient temperature is higher than or equal to the operating temperature upper limit of the laser, determine that the operating temperature upper limit of the laser is the target control temperature of the temperature controller.

Specifically, for example, it is assumed that the operating temperature upper limit of the laser is 60° C., when the external ambient temperature of the optical component is higher than or equal to the operating temperature upper limit of the laser, for example, the external ambient temperature of the optical component is 80° C., it may be determined that the target control temperature of the temperature controller is 60° C. Therefore, compared with the solution of setting a target control temperature to a constant temperature, for example, the constant temperature is 55° C., the method according to the embodiment of the present invention only needs the temperature controller to decrease the internal temperature of the optical component to 60° C., and therefore may enable the laser to work normally, but does not need the temperature controller to further decrease the internal temperature of the optical component from 60° C. to 55° C., which can obviously reduce the power consumption of the temperature controller.

That is, in the embodiment of the present invention, when the external ambient temperature is lower than or equal to the operating temperature lower limit of the laser, only the operating temperature lower limit of the laser needs to be determined to be the target control temperature of the temperature controller, so that while the laser works normally, the power consumption of the temperature controller can be obviously reduced.

In the embodiment of the present invention, optionally, as shown in FIG. 2, the setting a target control temperature of the temperature controller includes:

S123. When the external ambient temperature is lower than or equal to the operating temperature upper limit of the laser and the external ambient temperature is higher or equal to the operating temperature lower limit of the laser, determine that the external ambient temperature of the optical component is the target control temperature of the temperature controller.

That is, in the embodiment of the present invention, when the external ambient temperature is lower than or equal to the operating temperature upper limit of the laser and the external ambient temperature is higher than or equal to the operating temperature lower limit of the laser, it may be determined that the external ambient temperature of the optical component is the target control temperature of the temperature controller, so that when the temperature controller detects that the external ambient temperature is equal to the target control temperature, the temperature controller does not need to perform heating or cooling, and in this case, not only the laser can work properly, but also the power consumption of the temperature controller can be obviously reduced.

In the embodiment of the present invention, optionally, as shown in FIG. 2, the setting a target control temperature of the temperature controller includes:

S124. When the external ambient temperature is higher than or equal to the operating temperature lower limit of the laser, set the target control temperature to being in a linear relationship or curve linear relationship with the external ambient temperature.

Specifically, the target control temperature may be set to being in a linear relationship or curve linear relationship with the external ambient temperature, where the linear relationship is, for example, a liner function relationship or proportional function relationship, and the curve linear relationship is, for example, a quadratic function relationship, so that the temperature of the optical component changes smoothly, so as to further ensure output optical power, an extinction ratio, and the like of the laser to change smoothly in a temperature change process, which can reduce influence on a receiving end.

For example, as shown in FIG. 3, a relationship between a target control temperature of the temperature controller and an external ambient temperature is shown, where an abscissa axis indicates the external ambient temperature $T_{OSA}$, a longitudinal axis indicates the target control temperature $T_{TEC}$, $T_{TEC\_MIN}$ indicates the operating temperature lower limit of the laser, $T_{TEC\_MAX}$ indicates the operating temperature upper limit of the laser, $T_{OSA\_MIN}$ indicates an external ambient temperature lower limit of the optical component, and $T_{OSA\_MAX}$ indicates an external ambient temperature upper limit of the optical component. For example, the external ambient temperature lower limit of the optical component $T_{OSA\_MIN}$ is −10° C., and the external ambient temperature upper limit of the optical component $T_{OSA\_MAX}$ is 90° C.

As shown in FIG. 3, when the external ambient temperature $T_{OSA}$ is lower than or equal to the operating temperature lower limit $T_{TEC\_MIN}$ of the laser, it can be determined that the target control temperature $T_{TEC}$ of the temperature controller is $T_{TEC\_MIN}$; when the external ambient temperature $T_{OSA}$ is higher than or equal to the operating temperature lower limit $T_{TEC\_MIN}$ of the laser, the target control temperature $T_{TEC}$ is set to being in a linear relationship with the external ambient temperature, where the linear relationship may be determined by, for example, the following equation (1):

$$T_{TEC} = \frac{T_{TEC\_MAX} - T_{TEC\_MIN}}{T_{OSA\_MAX} - T_{TEC\_MIN}} \cdot T_{OSA} + \frac{T_{TEC\_MIN}(T_{OSA\_MAX} - T_{TEC\_MAX})}{T_{OSA\_MAX} - T_{TEC\_MIN}} \qquad (1)$$

For another example, the linear relationship may also be determined by the following equation (2):

$$T_{TEC} = T_{TEC\_MIN} + K \cdot \frac{T_{OSA} - T_{TEC\_MAX}}{T_{OSA\_MAX} - T_{TEC\_MAX}} \qquad (2)$$

where, K is a constant, or K is a function related to the external ambient temperature.

For still another example, a curve linear relationship in which the target control temperature is set to being with the external ambient temperature may be determined by the following equation (3):

$$T_{TEC} = a \cdot T_{OSA}^2 + b \cdot T_{OSA} + c \qquad (3)$$

where, a, b, and c are constants, and $T_{TEC\_MIN} = aT_{TEC\_MIN}^2 + bT_{TEC\_MIN} + c$.

It should be understood that, in various embodiments of the present invention, serial numbers of the foregoing processes do not indicate execution order, the execution order of each process should be determined by functions and internal logic of the processes, and shall constitute any limitation to an implementation process of the embodiment of the present invention.

Therefore, the method for controlling an operating temperature of an optical component in the embodiment of the present invention can, by means of acquiring an external ambient temperature of the optical component and setting a target control temperature of a temperature controller according to the external ambient temperature, dynamically adjust the target control temperature of the temperature controller and improve a temperature control manner of the temperature controller, therefore can avoid a problem of relatively large power consumption caused by controlling, by the temperature controller, a temperature of the optical component to a constant temperature, which can reduce a control current of the temperature controller, and can obviously reduce the power consumption of the temperature controller.

FIG. 4 shows another schematic flowchart of a method for controlling an operating temperature of an optical component according to an embodiment of the present invention. As shown in FIG. 4, in S201, an apparatus for controlling an operating temperature of an optical component acquires an external ambient temperature $T_{OSA}$ of an OSA. For example, the apparatus may acquire the external ambient temperature $T_{OSA}$ of the OSA by using various temperature sensors disposed outside the OSA.

In S202, the apparatus for controlling an operating temperature of an optical component compares whether the external ambient temperature $T_{OSA}$ is equal to a target control temperature $T_{TEC}$ of a temperature controller TEC; if yes, the procedure proceeds to S203; if not, the procedure proceeds to S204.

In S203, the apparatus for controlling an operating temperature of an optical component does not change the target control temperature $T_{TEC}$ of the TEC.

In S204, the apparatus for controlling an operating temperature of an optical component compares whether the external ambient temperature $T_{OSA}$ is higher than or equal to an operating temperature upper limit $T_{TEC\_MAX}$ of a laser; if yes, the procedure proceeds to S205; if not, the procedure proceeds to S206.

In S205, the apparatus for controlling an operating temperature of an optical component sets the target control temperature $T_{TEC}$ of the temperature controller TEC as the operating temperature upper limit $T_{TEC\_MAX}$ of the laser.

In S206, the apparatus for controlling an operating temperature of an optical component compares whether the external ambient temperature $T_{OSA}$ is lower than or equal to an operating temperature lower limit $T_{TEC\_MIN}$ of the laser; if yes, the procedure proceeds to S207; if not, the procedure proceeds to S208.

In S207, the apparatus for controlling an operating temperature of an optical component sets the target control temperature $T_{TEC}$ of the temperature controller TEC as the operating temperature lower limit $T_{TEC\_MIN}$ of the laser.

In S208, the apparatus for controlling an operating temperature of an optical component compares whether the external ambient temperature $T_{OSA}$ is higher than or equal to the operating temperature lower limit $T_{TEC\_MIN}$ of the laser, and whether the external ambient temperature $T_{OSA}$ is lower than or equal to the operating temperature upper limit $T_{TEC\_MAX}$ of the laser; if yes, the procedure proceeds to S209; if not, the procedure ends.

In S209, the apparatus for controlling an operating temperature of an optical component sets the target control temperature $T_{TEC}$ of the temperature controller TEC as the external ambient temperature $T_{OSA}$ of the OSA.

It should be understood that, in various embodiments of the present invention, serial numbers of the foregoing processes do not indicate execution order, the execution order of each process should be determined by functions and internal logic of the processes, and shall constitute any limitation to an implementation process of the embodiment of the present invention.

Therefore, the method for controlling an operating temperature of an optical component in the embodiment of the present invention can, by means of acquiring an external ambient temperature of the optical component and setting a target control temperature of a temperature controller according to the external ambient temperature, dynamically adjust the target control temperature of the temperature controller and improve a temperature control manner of the temperature controller, therefore can avoid a problem of relatively large power consumption caused by controlling, by the temperature controller, a temperature of the optical component to a constant temperature, which can reduce a control current of the temperature controller, and can obviously reduce the power consumption of the temperature controller.

Figure 5:
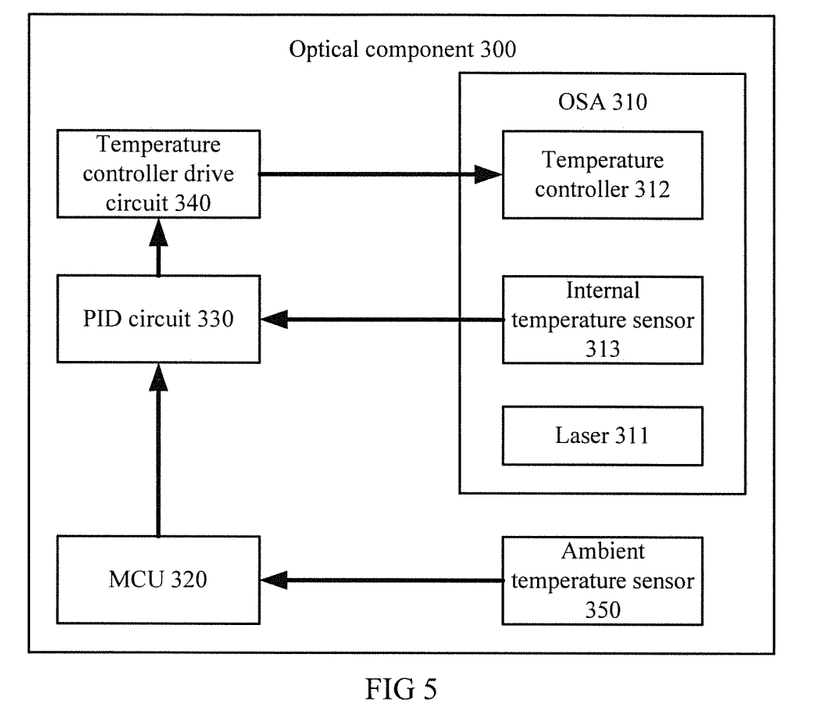
FIG. 5 is a schematic block diagram of an optical component according to an embodiment of the present invention.
Figure 6:
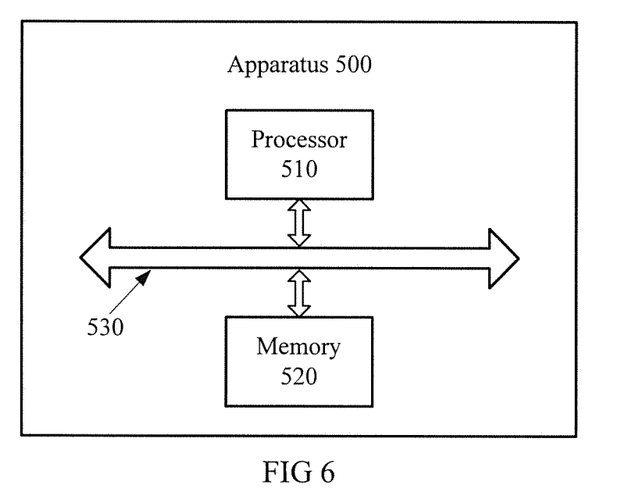
FIG. 6 is a schematic block diagram of an apparatus for controlling an operating temperature of an optical component according to an embodiment of the present invention.
Figure 7:
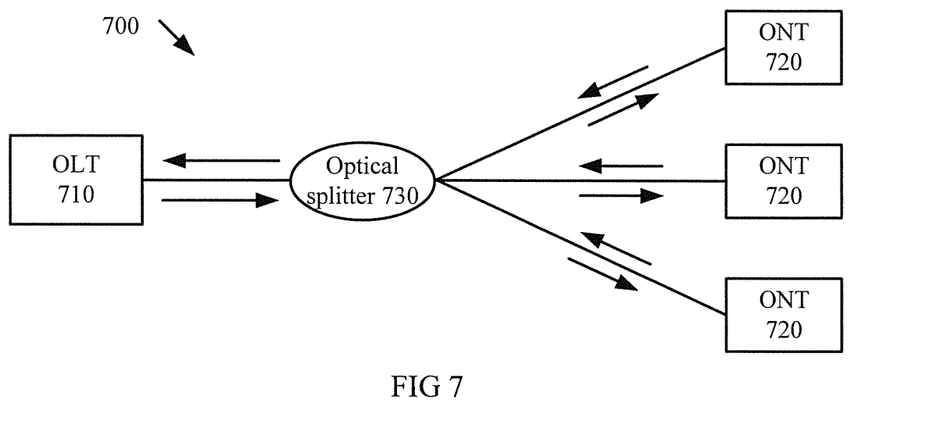
FIG. 7 is a schematic block diagram of an optical network system according to an embodiment of the present invention.

With reference to FIG. 1 to FIG. 4, the foregoing describes the method for controlling an operating temperature of an optical component according to the embodiments of the present invention in detail. With reference to FIG. 5 to FIG. 7, the following describes an apparatus, optical component, and optical network system for controlling an operating temperature of an optical component according to embodiments of the present invention in detail.

FIG. 5 shows a schematic block diagram of an optical component 300 according to an embodiment of the present invention. As shown in FIG. 5, the optical component 300 includes:

an optical sub-assembly OSA 310, where a laser 311, a temperature controller 312, and an internal temperature sensor 313 are disposed in the OSA 310, and the internal temperature sensor 313 is configured to detect an OSA temperature inside the OSA 310;

a micro control unit MCU 320, where the MCU 320 is configured to set a target control temperature of the temperature controller 312;

a proportional-integral-derivative PID circuit 330, where the PID circuit is configured to acquire the OSA temperature detected by the internal temperature sensor 313 and the target control temperature set by the MCU 320, and output a control value according to the target control temperature and the OSA temperature; and a temperature controller drive circuit 340, where the temperature controller drive circuit 340 is configured to provide, according to the control value output by the PID circuit 330, a current that is used for heating or cooling for the temperature controller 312, so as to control the temperature inside the OSA 310;

and the optical component 300 further includes an ambient temperature sensor 350 configured to detect an external ambient temperature of the OSA 330, and the MCU 320 is specifically configured to acquire the external ambient temperature that is of the OSA and is detected by the ambient temperature sensor 350, and set the target control temperature of the temperature controller 312 according to the external ambient temperature, where the target control temperature is a function value of the external ambient temperature and the target control temperature is within a range from an operating temperature lower limit of the laser 311 to an operating temperature upper limit of the laser 311.

Therefore, the optical component in the embodiment of the present invention can, by means of acquiring an external ambient temperature of the optical component and setting a target control temperature of a temperature controller according to the external ambient temperature, dynamically adjust the target control temperature of the temperature controller and improve a temperature control manner of the temperature controller, therefore can avoid a problem of relatively large power consumption caused by controlling, by the temperature controller, a temperature of the optical component to a constant temperature, which can reduce a control current of the temperature controller, and can obviously reduce the power consumption of the temperature controller.

In the embodiment of the present invention, optionally, the MCU 320 is specifically configured to: when the external ambient temperature is lower than or equal to the operating temperature lower limit of the laser 311, determine that the operating temperature lower limit of the laser 311 is the target control temperature of the temperature controller 312.

In the embodiment of the present invention, optionally, the MCU 320 is specifically configured to: when the external ambient temperature is higher than or equal to the operating temperature upper limit of the laser 311, determine that the operating temperature upper limit of the laser 311 is the target control temperature of the temperature controller 312.

In the embodiment of the present invention, optionally, the MCU 320 is specifically configured to: when the external ambient temperature is lower than or equal to the operating temperature upper limit of the laser 311 and the external ambient temperature is higher or equal to the operating temperature lower limit of the laser 311, determine that the external ambient temperature of the optical component 300 is the target control temperature of the temperature controller 312.

In the embodiment of the present invention, optionally, the MCU 320 is specifically configured to: when the external ambient temperature is higher than or equal to the operating temperature lower limit of the laser 311, set the target control temperature to being in a linear relationship or curve linear relationship with the external ambient temperature.

In the embodiment of the present invention, optionally, the operating temperature lower limit of the laser 311 is within a range from 45° C. to 54° C.; and/or
the operating temperature upper limit of the laser 311 is within a range from 56° C. to 65° C.

Specifically, in the embodiment of the present invention, the laser is, for example, an EML laser and the temperature controller is, for example, a TEC. The operating temperature lower limit of the laser may be such as 45° C., 48° C., 50° C., 52° C., or 54° C. It should be understood that, the operating temperature lower limit of the laser may also be another temperature value, for example, the operating temperature lower limit of the laser is within a range from 50° C. to 55° C.; for another example, the operating temperature lower limit of the laser is within a range from 40° C. to 50° C.; and for still another example, the operating temperature lower limit of the laser is within a range from 50° C. to 60° C. For example, the operating temperature lower limit of the laser may be 40° C., 45° C., 50° C., 55° C., 60° C., or the like.

According to another aspect, in the embodiment of the present invention, the operating temperature upper limit of the laser may be such as 56° C., 58° C., 60° C., 62° C., or 65° C. It should be understood that, the operating temperature upper limit of the laser may also be another temperature value, for example, the operating temperature upper limit of the laser is within a range from 55° C. to 60° C.; for another example, the operating temperature upper limit of the laser is within a range from 45° C. to 55° C.; and for still another example, the operating temperature upper limit of the laser is within a range from 55° C. to 65° C. For example, the operating temperature upper limit of the laser may be 45° C., 50° C., 55° C., 60° C., 65° C., or the like.

In the embodiment of the present invention, optionally, the laser 311 is an electricity absorb modulate laser EML, and the temperature controller 312 is a thermal electric cooler TEC.

It should be understood that, in the embodiment of the present invention, the laser 311 may also be another laser, for example, the laser 311 may be a DFB laser.

It should be understood that, in the embodiment of the present invention, the optical component 300 according to the embodiment of the present invention may correspond to execution bodies of the methods according to the embodiments of the present invention, and the foregoing and other operations and/or functions of each module in the optical component 300 are respectively intended for implementing corresponding procedures of the methods in FIG. 1 to FIG. 4, which, for brevity, are not repeated here any further.

Therefore, the optical component in the embodiment of the present invention can, by means of acquiring an external ambient temperature of the optical component and setting a target control temperature of a temperature controller according to the external ambient temperature, dynamically adjust the target control temperature of the temperature controller and improve a temperature control manner of the temperature controller, therefore can avoid a problem of relatively large power consumption caused by controlling, by the temperature controller, a temperature of the optical component to a constant temperature, which can reduce a control current of the temperature controller, and can obviously reduce the power consumption of the temperature controller.

FIG. 6 shows a schematic block diagram of an apparatus 500 for controlling an operating temperature of an optical component according to an embodiment of the present invention. The optical component includes a laser and a temperature controller that is used for heating or cooling inside the optical component. As shown in FIG. 6, the apparatus 500 includes: a processor 510, a memory 520, and a bus system 530, the processor 510 is connected to the memory 520 by using the bus system 530, the memory 520 is configured to store an instruction, and the processor 510 is configured to execute the instruction stored in the memory 520, where the processor 510 is configured to: acquire an external ambient temperature of the optical component; set a target control temperature of the temperature controller according to the external ambient temperature, where the target control temperature is a function value of the external ambient temperature, and the target control temperature is within a range from an operating temperature lower limit of the laser to an operating temperature upper limit of the laser; and control, according to the target control temperature, an operating temperature of the optical component by means of heating or cooling by using the temperature controller.

Therefore, the apparatus for controlling an operating temperature of an optical component in the embodiment of the present invention can, by means of acquiring an external ambient temperature of the optical component and setting a target control temperature of a temperature controller according to the external ambient temperature, dynamically adjust the target control temperature of the temperature controller and improve a temperature control manner of the temperature controller, therefore can avoid a problem of relatively large power consumption caused by controlling, by the temperature controller, a temperature of the optical component to a constant temperature, which can reduce a control current of the temperature controller, and can obviously reduce the power consumption of the temperature controller.

It should be understood that, in the embodiment of the present invention, the processor 510 may be a central processing unit (CPU for short), and the processor 510 may also be a universal processor, a digital signal processor (DSP), an application-specific integrated circuit (ASIC), a field programmable gate array (FPGA), or a programmable logical device, a discrete gate or transistor logic device, a discrete hardware assembly, and the like. The universal processor may be a microprocessor or the processor may also be any conventional processor.

The memory 520 may include a read-only memory and random access memory, and provide an instruction and data for the processor 510. A part of the memory 520 may also include a non-volatile random-access memory. For example, the memory 520 may also store information about a device type.

In addition to a data bus, the bus system 530 may also include a power bus, a control bus, a state signal bus, and the like. Nevertheless, for clear description, various buses in the figure are marked as the bus system 530.

In an implementation process, all steps of the foregoing method may be completed by integrated logic circuits of hardware in the processor 510 or instructions in a software form. The steps of the method disclosed in the embodiments of the present invention may be completed directly by a hardware processor, or completed by a combination of hardware and software modules in the processor. The software module may be located in a mature storage medium in the art, such as a random access memory, a flash memory, a read-only memory, a programmable read-only memory, an electrically erasable programmable memory, or a register. The storage medium is located in the memory 520, and the processor 510 reads information in the memory 520 and completes the steps of the foregoing method with reference to hardware of the processor 510. To avoid repetition, detailed description is not provided repeatedly herein.

Optionally, as an embodiment, the processor 510 sets the target control temperature of the temperature controller, including: when the external ambient temperature is lower than or equal to the operating temperature lower limit of the laser, determining that the operating temperature lower limit of the laser is the target control temperature of the temperature controller.

Optionally, as an embodiment, the processor 510 sets the target control temperature of the temperature controller, including: when the external ambient temperature is higher than or equal to the operating temperature upper limit of the laser, determining that the operating temperature upper limit of the laser is the target control temperature of the temperature controller.

Optionally, as an embodiment, the processor 510 sets the target control temperature of the temperature controller, including: when the external ambient temperature is lower than or equal to the operating temperature upper limit of the laser and the external ambient temperature is higher than or equal to the operating temperature lower limit of the laser, determining that the external ambient temperature of the optical component is the target control temperature of the temperature controller.

Optionally, as an embodiment, the processor 510 sets the target control temperature of the temperature controller, including: when the external ambient temperature is higher than or equal to the operating temperature lower limit of the laser, setting the target control temperature to being in a linear relationship or curve linear relationship with the external ambient temperature.

Optionally, as an embodiment, the operating temperature lower limit of the laser is within a range from 45° C. to 54° C.; and/or the operating temperature upper limit of the laser is within a range from 56° C. to 65° C.

Optionally, as an embodiment, the laser is an electricity absorb modulate laser EML, and the temperature controller is a thermal electric cooler TEC.

It should be understood that, in the embodiment of the present invention, the apparatus 500 for controlling an operating temperature of an optical component according to the embodiment of the present invention may correspond to execution bodies of the methods according to the embodiments of the present invention, and may correspond to the optical component 300 according to the embodiment of the present invention, and the foregoing and other operations and/or functions of each module in the apparatus 500 are respectively intended for implementing corresponding procedures of the methods in FIG. 1 to FIG. 4, which, for brevity, are not repeated here any further.

Therefore, the apparatus for controlling an operating temperature of an optical component in the embodiment of the present invention can, by means of acquiring an external ambient temperature of the optical component and setting a target control temperature of a temperature controller according to the external ambient temperature, dynamically adjust the target control temperature of the temperature controller and improve a temperature control manner of the temperature controller, therefore can avoid a problem of relatively large power consumption caused by controlling, by the temperature controller, a temperature of the optical component to a constant temperature, which can reduce a control current of the temperature controller, and can obviously reduce the power consumption of the temperature controller.

As shown in FIG. 7, an embodiment of the present invention further provide an optical network system 700, where the optical network system 700 includes:

an optical line terminal OLT 710, where the OLT 710 includes the optical component according to the embodiment of the present invention, or the apparatus according to the embodiment of the present invention;

at least one optical network terminal ONT 720; and an optical splitter 730, where the at least one ONT 720 is connected to the OLT 710 by using the optical splitter 730;

and the optical component includes:

an optical sub-assembly OSA, where a laser, a temperature controller, and an internal temperature sensor are disposed in the OSA, and the internal temperature sensor is configured to detect an OSA temperature inside the OSA;

a micro control unit MCU, where the MCU is configured to set a target control temperature of the temperature controller;

a proportional-integral-derivative PID circuit, where the PID circuit is configured to acquire the OSA temperature detected by the internal temperature sensor and the target control temperature set by the MCU, and output a control value according to the target control temperature and OSA temperature; and a temperature controller drive circuit, where the temperature controller drive circuit is configured to provide, according to the control value output by the PID circuit, a current that is used heating or cooling for the temperature controller, so as to control the temperature inside the OSA;

and the optical component further includes an ambient temperature sensor configured to detect an external ambient temperature of the OSA, and the MCU is specifically configured to acquire the external ambient temperature that is of the OSA and is detected by the ambient temperature sensor, and set the target control temperature of the temperature controller according to the external ambient temperature, where the target control temperature is a function value of the external ambient temperature and the target control temperature is within a range from an operating temperature lower limit of the laser to an operating temperature upper limit of the laser;

the apparatus includes a processor, a memory, and a bus system, where the processor and the memory are connected by using the bus system, the memory is configured to store an instruction, the processor is configured to execute the instruction stored in the memory, and the processor is configured to: acquire an external ambient temperature of the optical component; set, according to the external ambient temperature, a target control temperature of the temperature controller that is used for heating or cooling inside the optical component, where the target control temperature is a function value of the external ambient temperature, and the target control temperature is within the range from the operating temperature lower limit of the laser to the operating temperature upper limit of the laser; and control, according to the target control temperature, an operating temperature of the optical component by means of heating or cooling by using the temperature controller.

Therefore, the optical network system in the embodiment of the present invention can, by means of acquiring an external ambient temperature of an optical component and setting a target control temperature of a temperature controller according to the external ambient temperature, dynamically adjust the target control temperature of the temperature controller and improve a temperature control manner of the temperature controller, therefore can avoid a problem of relatively large power consumption caused by controlling, by the temperature controller, a temperature of the optical component to a constant temperature, which can reduce a control current of the temperature controller, and can obviously reduce the power consumption of the temperature controller.

In the embodiment of the present invention, the optical network system may be a passive optical network (PON for short), and the PON system may include an optical line terminal OLT and optical network terminal ONT/optical network unit ONU that are located at a central office end, where one OLT may be connected to one or more ONTs/ONUs by using an optical splitter, such as a passive optical splitter.

It should be further understood that, in the embodiment of the present invention, for ease of description, the following uses an ONT to replace an ONT and/or ONU for description, but the present invention is not limited to this.

It should be further understood that, the PON system may be, for example, a gigabit-capable passive optical networks (GPON) system, an EPON system, or an XG PON, and the like. Furthermore, for ease of description, the following uses a 10 G PON system as an example for description, but the present invention is not limited to this.

Optionally, as an embodiment, the MCU is specifically configured to: when the external ambient temperature is lower than or equal to the operating temperature lower limit of the laser, determine that the operating temperature lower limit of the laser is the target control temperature of the temperature controller.

In the embodiment of the present invention, optionally, the MCU is specifically configured to: when the external ambient temperature is higher than or equal to the operating temperature upper limit of the laser, determine that the operating temperature upper limit of the laser is the target control temperature of the temperature controller.

In the embodiment of the present invention, optionally, the MCU is specifically configured to: when the external ambient temperature is lower than or equal to the operating temperature upper limit of the laser and the external ambient temperature is higher or equal to the operating temperature lower limit of the laser, determine that the external ambient temperature of the optical component is the target control temperature of the temperature controller.

In the embodiment of the present invention, optionally, the MCU is specifically configured to: when the external ambient temperature is higher than or equal to the operating temperature lower limit of the laser, set the target control temperature to being in a linear relationship or curve linear relationship with the external ambient temperature.

In the embodiment of the present invention, optionally, the operating temperature lower limit of the laser is within a range from 45° C. to 54° C.; and/or the operating temperature upper limit of the laser is within a range from 56° C. to 65° C.

Specifically, in the embodiment of the present invention, the laser is, for example, an EML laser and the temperature controller is, for example, a TEC. The operating temperature lower limit of the laser may be such as 45° C., 48° C., 50° C., 52° C., or 54° C. It should be understood that, the operating temperature lower limit of the laser may also be another temperature value, for example, the operating temperature lower limit of the laser is within a range from 50° C. to 55° C.; for another example, the operating temperature lower limit of the laser is within a range from 40° C. to 50° C.; and for still another example, the operating temperature lower limit of the laser is within a range from 50° C. to 60° C. For example, the operating temperature lower limit of the laser may be 40° C., 45° C., 50° C., 55° C., 60° C., or the like.

According to another aspect, in the embodiment of the present invention, the operating temperature upper limit of the laser may be such as 56° C., 58° C., 60° C., 62° C., or 65° C. It should be understood that, the operating temperature upper limit of the laser may also be another temperature value, for example, the operating temperature upper limit of the laser is within a range from 55° C. to 60° C.; for another example, the operating temperature upper limit of the laser is within a range from 45° C. to 55° C.; and for still another example, the operating temperature upper limit of the laser is within a range from 55° C. to 65° C. For example, the operating temperature upper limit of the laser may be 45° C., 50° C., 55° C., 60° C., 65° C., or the like.

In the embodiment of the present invention, optionally, the laser is an electricity absorb modulate laser EML, and the temperature controller is a thermal electric cooler TEC.

It should be understood that, in the embodiment of the present invention, the laser may also be another laser, for example, the laser may be a DFB laser.

Optionally, as an embodiment, the processor sets the target control temperature of the temperature controller, including: when the external ambient temperature is lower than or equal to the operating temperature lower limit of the laser, determining that the operating temperature lower limit of the laser is the target control temperature of the temperature controller.

Optionally, as an embodiment, the processor sets the target control temperature of the temperature controller, including: when the external ambient temperature is higher than or equal to the operating temperature upper limit of the laser, determining that the operating temperature upper limit of the laser is the target control temperature of the temperature controller.

Optionally, as an embodiment, the processor sets the target control temperature of the temperature controller, including: when the external ambient temperature is lower than or equal to the operating temperature upper limit of the laser and the external ambient temperature is higher than or equal to the operating temperature lower limit of the laser, determining that the external ambient temperature of the optical component is the target control temperature of the temperature controller.

Optionally, as an embodiment, the processor sets the target control temperature of the temperature controller, including: when the external ambient temperature is higher than or equal to the operating temperature lower limit of the laser, setting the target control temperature to being in a linear relationship or curve linear relationship with the external ambient temperature.

Optionally, as an embodiment, the operating temperature lower limit of the laser is within a range from 45° C. to 54° C.; and/or the operating temperature upper limit of the laser is within a range from 56° C. to 65° C.

Optionally, as an embodiment, the laser is an electricity absorb modulate laser EML and the temperature controller is a thermal electric cooler TEC.

It should be understood that, in the embodiment of the present invention, the optical component included in the optical network system 700 according to the embodiment of the present invention may correspond to execution bodies of the methods according to the embodiments of the present invention and the optical component 300 according to the embodiment of the present invention, the foregoing and other operations and/or functions of each module in the optical component included in the optical network system 700 are respectively intended for implementing corresponding procedures of the methods in FIG. 1 to FIG. 4, which, for brevity, are not repeated here any further.

It should be further understood that, in the embodiment of the present invention, the apparatus included in the optical network system 700 according to the embodiment of the present invention may correspond to the execution bodies of the methods according to the embodiments of the present invention and the apparatus 500 for controlling an operating temperature of an optical component according to the embodiment of the present invention, and the foregoing and other operations and/or functions of each module in the apparatus included in the optical network system 700 are respectively intended for implementing corresponding procedures of the methods in FIG. 1 to FIG. 4, which, for brevity, are not repeated here any further.

Therefore, the optical network system in the embodiment of the present invention can, by means of acquiring an external ambient temperature of an optical component and setting a target control temperature of a temperature controller according to the external ambient temperature, dynamically adjust the target control temperature of the temperature controller and improve a temperature control manner of the temperature controller, therefore can avoid a problem of relatively large power consumption caused by controlling, by the temperature controller, a temperature of the optical component to a constant temperature, which can reduce a control current of the temperature controller, and can obviously reduce the power consumption of the temperature controller.

Furthermore, the terms "system" and "network" in this specification are often used interchangeably in this specification. The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that, in the embodiments of the present invention, "B corresponding to A" indicates that B and A are associated and B can be determined according to A. But it should be further understood that, determining B according to A does not mean that B is determined only according to A, but B may also be determined according to A and/or other information.

A person of ordinary skill in the art may be aware that, with reference to the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a specific working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present invention.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or a part of the technical solutions may be implemented in the form of a software product. The software product is stored in a storage medium and includes several instructions for instructing a computer device (which may be a personal computer, a server, or a network device) to perform all or a part of the steps of the methods described in the embodiments of the present invention. The foregoing storage medium includes: any medium that can store program code, such as a USB flash drive, a removable hard disk, a read-only memory (ROM), a random access memory (RAN), a magnetic disk, or an optical disc.

The foregoing descriptions are merely specific embodiments of the present invention, but are not intended to limit the protection scope of the present invention. Any modification or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A method for controlling an operating temperature of an optical component, wherein the optical component comprises a laser and a temperature controller that is used for heating or cooling inside the optical component, the method comprising:
    acquiring a temperature inside the optical component;
    acquiring a target control temperature of the temperature controller;
    sending a control value according to the target control temperature and the temperature inside the optical component, the control value associated with heating or cooling for the temperature controller, so as to control the temperature inside the optical component;
    acquiring an external ambient temperature of the optical component;
    setting the target control temperature of the temperature controller according to the external ambient temperature, wherein the target control temperature is a function value of the external ambient temperature and the target control temperature is within a range from an operating temperature lower limit of the laser to an operating temperature upper limit of the laser; and
    controlling, according to the target control temperature, an operating temperature of the optical component by means of heating or cooling by using the temperature controller.

2. The method according to claim 1, wherein setting the target control temperature of the temperature controller comprises:
    when the external ambient temperature is lower than or equal to the operating temperature lower limit of the laser, determining that the operating temperature lower limit of the laser is the target control temperature of the temperature controller.

3. The method according to claim 1, wherein setting the target control temperature of the temperature controller comprises:
    when the external ambient temperature is higher than or equal to the operating temperature upper limit of the laser, determining that the operating temperature upper limit of the laser is the target control temperature of the temperature controller.

4. The method according to claim 1, wherein setting the target control temperature of the temperature controller comprises:
    when the external ambient temperature is lower than or equal to the operating temperature upper limit of the laser and the external ambient temperature is higher or equal to the operating temperature lower limit of the laser, determining that the external ambient temperature of the optical component is the target control temperature of the temperature controller.

5. The method according to claim 1, wherein setting the target control temperature of the temperature controller comprises:
    when the external ambient temperature is higher than or equal to the operating temperature lower limit of the laser, setting the target control temperature to being in a linear relationship or curve linear relationship with the external ambient temperature.

6. The method according to claim 1, wherein:
    the operating temperature lower limit of the laser is within a range from 45° C. to 54° C.; and/or
    the operating temperature upper limit of the laser is within a range from 56° C. to 65° C.

7. An optical component, comprising:
    an optical sub-assembly (OSA), wherein a laser, a temperature controller, and an internal temperature sensor are disposed in the OSA, and the internal temperature sensor is configured to detect an OSA temperature inside the OSA;
    a micro control unit (MCU) configured to set a target control temperature of the temperature controller;
    a proportional-integral-derivative (PID) circuit configured to acquire the OSA temperature detected by the internal temperature sensor and the target control temperature set by the MCU, and output a control value according to the target control temperature and the OSA temperature;
    a temperature controller drive circuit configured to provide, according to the control value output by the PID circuit, a current that is used for heating or cooling for the temperature controller, so as to control the OSA temperature inside the OSA; and
    wherein the optical component further comprises an ambient temperature sensor configured to detect an external ambient temperature of the OSA, and the MCU is configured to acquire the external ambient temperature of the OSA and detected by the ambient temperature sensor, and set the target control temperature of the temperature controller according to the external ambient temperature, wherein the target control temperature is a function value of the external ambient temperature and the target control temperature is within a range from an operating temperature lower limit of the laser to an operating temperature upper limit of the laser.

8. The optical component according to claim 7, wherein the MCU is configured to:
    when the external ambient temperature is lower than or equal to the operating temperature lower limit of the laser, determine that the operating temperature lower limit of the laser is the target control temperature of the temperature controller.

9. The optical component according to claim 7, wherein the MCU is configured to:

when the external ambient temperature is higher than or equal to the operating temperature upper limit of the laser, determine that the operating temperature upper limit of the laser is the target control temperature of the temperature controller.

10. The optical component according to claim 7, wherein the MCU is configured to:
when the external ambient temperature is lower than or equal to the operating temperature upper limit of the laser and the external ambient temperature is higher or equal to the operating temperature lower limit of the laser, determine that the external ambient temperature of the optical component is the target control temperature of the temperature controller.

11. The optical component according to claim 7, wherein the MCU is configured to:
when the external ambient temperature is higher than or equal to the operating temperature lower limit of the laser, set the target control temperature to being in a linear relationship or curve linear relationship with the external ambient temperature.

12. The optical component according to claim 7, wherein:
the operating temperature lower limit of the laser is within a range from 45° C. to 54° C.; and/or
the operating temperature upper limit of the laser is within a range from 56° C. to 65° C.

13. An apparatus for controlling an operating temperature of an optical component, wherein the optical component comprises a laser and a temperature controller that is used for heating or cooling inside the optical component, the apparatus comprising:
a processor, a memory, and a bus system, wherein the processor is connected to the memory by using the bus system, the memory is configured to store an instruction, and the processor is configured to execute the instruction stored in the memory; and
wherein the processor is configured to:
acquire a temperature inside the optical component,
acquire a target control temperature of the temperature controller,
output a control value according to the target control temperature and the temperature inside the optical component, the control value associated with heating or cooling for the temperature controller, so as to control the temperature inside the optical component,
acquire an external ambient temperature of the optical component,
set the target control temperature of the temperature controller according to the external ambient temperature, wherein the target control temperature is a function value of the external ambient temperature, and the target control temperature is within a range from an operating temperature lower limit of the laser to an operating temperature upper limit of the laser, and
control, according to the target control temperature, an operating temperature of the optical component by means of heating or cooling by using the temperature controller.

14. The apparatus according to claim 13, wherein the processor is further configured to:
when the external ambient temperature is lower than or equal to the operating temperature lower limit of the laser, determine that the operating temperature lower limit of the laser is the target control temperature of the temperature controller.

15. The apparatus according to claim 13, wherein the processor is further configured to:
when the external ambient temperature is higher than or equal to the operating temperature upper limit of the laser, determine that the operating temperature upper limit of the laser is the target control temperature of the temperature controller.

16. The apparatus according to claim 13, wherein the processor is further configured to:
when the external ambient temperature is lower than or equal to the operating temperature upper limit of the laser and the external ambient temperature is higher or equal to the operating temperature lower limit of the laser, determine that the external ambient temperature of the optical component is the target control temperature of the temperature controller.

17. The apparatus according to claim 13, wherein the processor is further configured to:
when the external ambient temperature is higher than or equal to the operating temperature lower limit of the laser, set the target control temperature to being in a linear relationship or curve linear relationship with the external ambient temperature.

18. The apparatus according to claim 13, wherein:
the operating temperature lower limit of the laser is within a range from 45° C. to 54° C.; and/or
the operating temperature upper limit of the laser is within a range from 56° C. to 65° C.

19. An optical network system, comprising:
an optical line terminal (OLT);
at least one optical network terminal (ONT);
an optical splitter, wherein the at least one ONT is connected to the OLT by using the optical splitter;
wherein the OLT comprises an optical sub-assembly (OSA), wherein a laser, a temperature controller, and an internal temperature sensor are disposed in the OSA, and the internal temperature sensor is configured to detect an OSA temperature inside the OSA;
a micro control unit (MCU) configured to set a target control temperature of the temperature controller;
a proportional-integral-derivative (PID) circuit configured to acquire the OSA temperature detected by the internal temperature sensor and the target control temperature set by the MCU, and output a control value according to the target control temperature and the OSA temperature;
a temperature controller drive circuit configured to provide, according to the control value output by the PID circuit, a current that is used for heating or cooling for the temperature controller, so as to control the OSA temperature inside the OSA; and
wherein the optical component further comprises an ambient temperature sensor configured to detect an external ambient temperature of the OSA, and the MCU is configured to acquire the external ambient temperature of the OSA and detected by the ambient temperature sensor, and set the target control temperature of the temperature controller according to the external ambient temperature, wherein the target control temperature is a function value of the external ambient temperature and the target control temperature is within a range from an operating temperature lower limit of the laser to an operating temperature upper limit of the laser.

* * * * *